United States Patent
Consoli et al.

(10) Patent No.: US 10,411,378 B2
(45) Date of Patent: Sep. 10, 2019

(54) CIRCUIT CARD ASSEMBLIES FOR A COMMUNICATION SYSTEM

(71) Applicant: TE CONNECTIVITY CORPORATION, Berwyn, PA (US)

(72) Inventors: John Joseph Consoli, Harrisburg, PA (US); Matthew Jeffrey Sypolt, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/945,802

(22) Filed: Apr. 5, 2018

(65) Prior Publication Data

US 2019/0052008 A1 Feb. 14, 2019

Related U.S. Application Data

(60) Provisional application No. 62/543,084, filed on Aug. 9, 2017.

(51) Int. Cl.
*H05K 1/14* (2006.01)
*H05K 7/14* (2006.01)
(Continued)

(52) U.S. Cl.
CPC .......... *H01R 12/737* (2013.01); *H01R 12/87* (2013.01); *H01R 13/62905* (2013.01);
(Continued)

(58) Field of Classification Search
CPC .. H01R 12/737; H01R 12/7064; H01R 13/05; H05K 1/14; H05K 7/1417;
(Continued)

(56) References Cited

U.S. PATENT DOCUMENTS 3,587,029 A 6/1971 Knowles
4,560,221 A 12/1985 Olsson
(Continued)

FOREIGN PATENT DOCUMENTS

EP 2346117 A2 7/2011
EP 2451262 A2 5/2012
(Continued)

OTHER PUBLICATIONS

Kerridge et al., 'Fast Backplane Connectors Disguise Digital Transmission Lines,' (Texas Instrument), Reed Business Information, Highlands Ranch, Co, US, vol. 42, No. Europe, May 8, 1997, XP000724062.
(Continued)

*Primary Examiner* — Abhishek M Rathod

(57) ABSTRACT

A communication system includes first and second circuit card assemblies mated such that first and second PCBs move relative to each other along a board mating axis parallel to a slot in the first PCB with the first PCB oriented perpendicular to the second PCB and with first and second mating ends of first and second electrical connectors oriented parallel to the board mating axis. The first and second circuit card assemblies are mated such that the first electrical connector and the second electrical connector move relative to each other along a connector mating axis perpendicular to the board mating axis. First mating interfaces of first contacts are mated to second mating interfaces of second contacts in a contact mating direction non-parallel to the board mating axis and non-parallel to the connector mating axis.

19 Claims, 9 Drawing Sheets

(51) Int. Cl.
  *H01R 12/73* (2011.01)
  *H01R 12/87* (2011.01)
  *H01R 13/629* (2006.01)
  *H01R 12/70* (2011.01)
  *H01R 12/71* (2011.01)
  *H01R 12/72* (2011.01)
  *H01R 13/05* (2006.01)

(52) U.S. Cl.
  CPC ............. *H05K 1/14* (2013.01); *H05K 7/1417* (2013.01); *H01R 12/7064* (2013.01); *H01R 12/712* (2013.01); *H01R 12/727* (2013.01); *H01R 13/05* (2013.01); *H05K 2201/048* (2013.01); *H05K 2201/09063* (2013.01); *H05K 2201/10325* (2013.01); *H05K 2201/10333* (2013.01)

(58) Field of Classification Search
  CPC ... H05K 2201/048; H05K 2201/09063; H05K 2201/10333; H05K 2201/10325
  See application file for complete search history.

(56) References Cited

U.S. PATENT DOCUMENTS

| | | | |
|---|---|---|---|
| 5,114,353 A | 5/1992 | Sample | |
| 5,676,559 A | 10/1997 | Laub et al. | |
| 6,796,822 B2 | 9/2004 | Sato et al. | |
| 6,918,775 B2* | 7/2005 | Korsunsky | H01R 13/193 439/65 |
| 7,086,866 B1 | 8/2006 | Folan et al. | |
| 7,322,834 B2 | 1/2008 | Hu et al. | |
| 7,326,092 B2 | 2/2008 | Fedder et al. | |
| 7,435,095 B1* | 10/2008 | Yi | H01R 12/52 439/61 |
| 7,540,744 B1 | 6/2009 | Minich | |
| 7,708,578 B1 | 5/2010 | Lenox | |
| 7,771,207 B2 | 8/2010 | Hamner et al. | |
| 7,789,668 B1 | 9/2010 | Hamner et al. | |
| 7,824,187 B1* | 11/2010 | Yi | H01R 13/514 439/65 |
| 7,918,683 B1 | 4/2011 | Hamner et al. | |
| 7,988,457 B1 | 8/2011 | Morgan | |
| 8,113,851 B2 | 2/2012 | Hamner et al. | |
| 8,199,511 B2 | 6/2012 | Kim et al. | |
| 8,376,766 B1 | 2/2013 | Huettner et al. | |
| 8,512,081 B2 | 8/2013 | Stokoe | |
| 8,684,610 B2 | 4/2014 | Nichols et al. | |
| 9,551,625 B2 | 1/2017 | Brugger | |
| 9,608,371 B2 | 3/2017 | Bonzom et al. | |
| 9,608,382 B2 | 3/2017 | McClellan et al. | |
| 9,917,406 B1 | 3/2018 | Iwasaki et al. | |
| 2002/0071259 A1 | 6/2002 | Roos | |
| 2005/0064733 A1 | 3/2005 | Korsunsky et al. | |
| 2005/0070136 A1* | 3/2005 | Korsunsky | H05K 1/14 439/74 |
| 2005/0181637 A1* | 8/2005 | Williams | H05K 1/144 439/65 |
| 2007/0184676 A1 | 8/2007 | Minich | |
| 2008/0045087 A1 | 2/2008 | Yi et al. | |
| 2014/0065849 A1 | 3/2014 | Kida et al. | |
| 2016/0006150 A1* | 1/2016 | Bachmutsky | H01R 12/722 439/65 |
| 2018/0040989 A1 | 2/2018 | Chen | |
| 2018/0261941 A1* | 9/2018 | Consoli | H01R 12/737 |

FOREIGN PATENT DOCUMENTS

| | | |
|---|---|---|
| JP | 2003044794 A | 2/2003 |
| TW | M537321 U | 2/2017 |
| WO | 2007092113 A2 | 8/2007 |

OTHER PUBLICATIONS

ISR and Written Opinion issued for PCT/IB2018/055472 dated Oct. 25, 2018.
U.S. Appl. No. 15/945,821, filed Apr. 5, 2018.
Co-pending U.S. Appl. No. 15/945,787, filed Apr. 5, 2018.
Co-pending U.S. Appl. No. 15/945,767, filed Apr. 5, 2018.
Co-pending U.S. Appl. No. 15/945,775, filed Apr. 5, 2018.
Co-pending U.S. Appl. No. 15/945,812, filed Apr. 5, 2018.

* cited by examiner

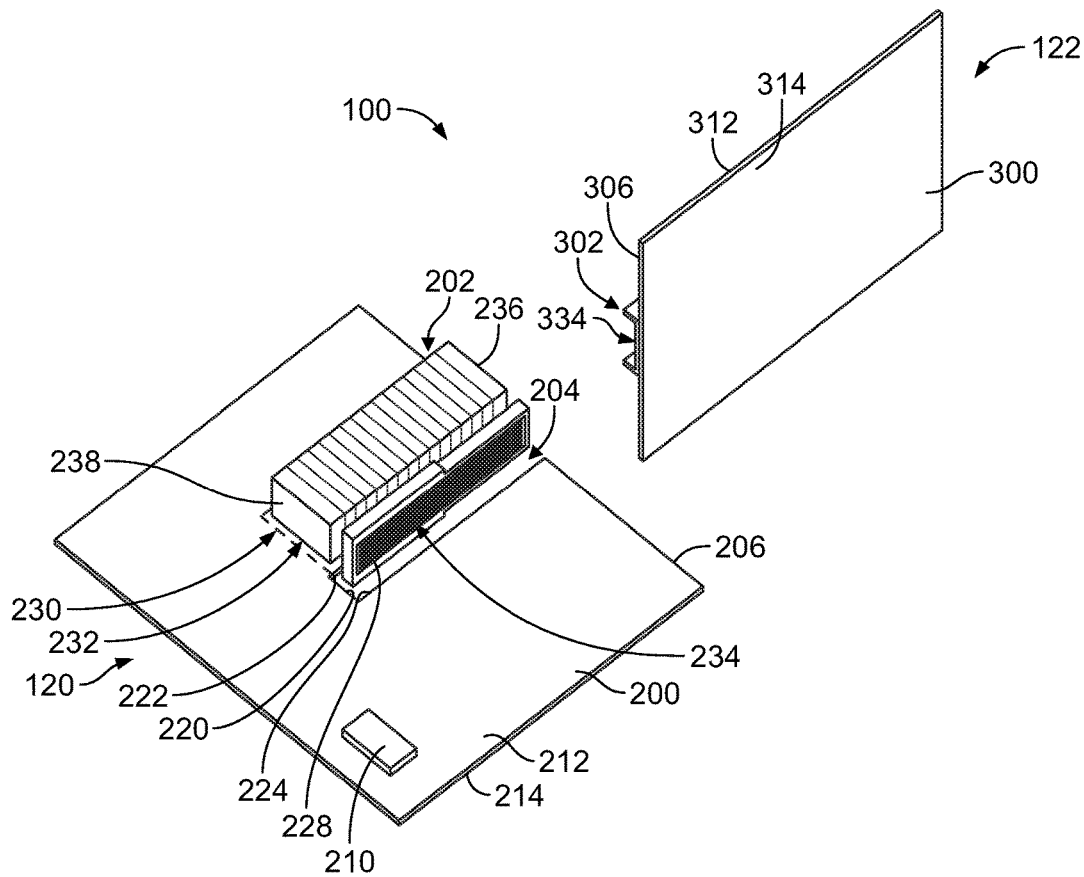
FIG. 5
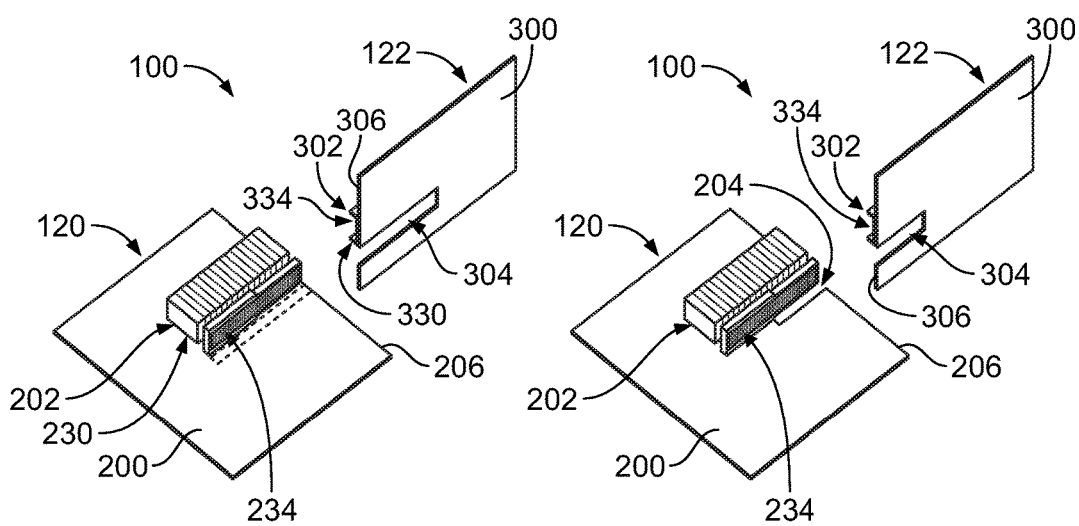
FIG. 6
FIG. 7

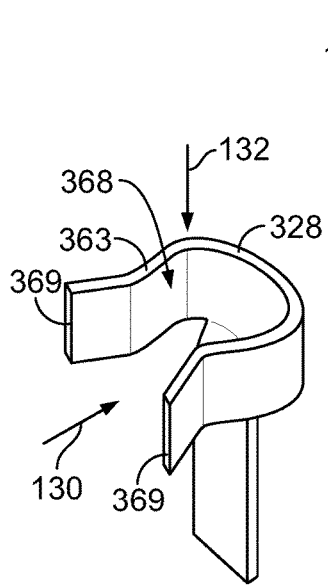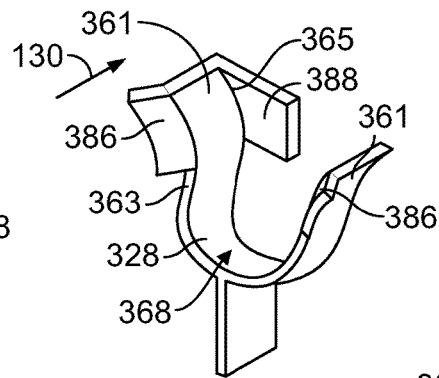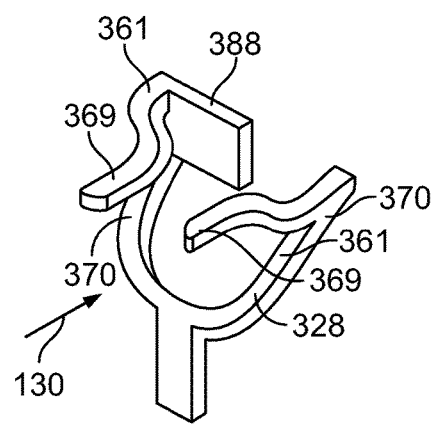
FIG. 20
FIG. 19
FIG. 21
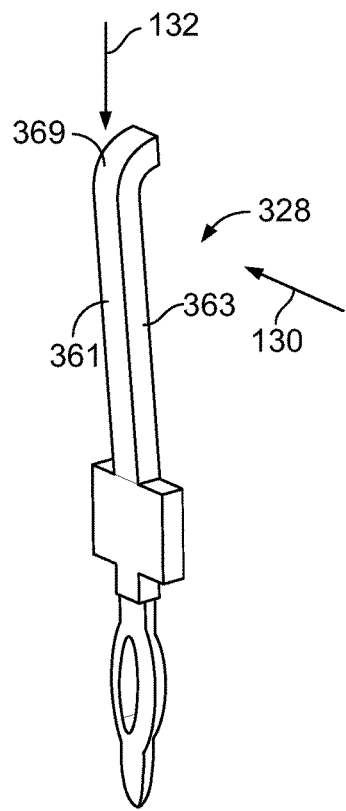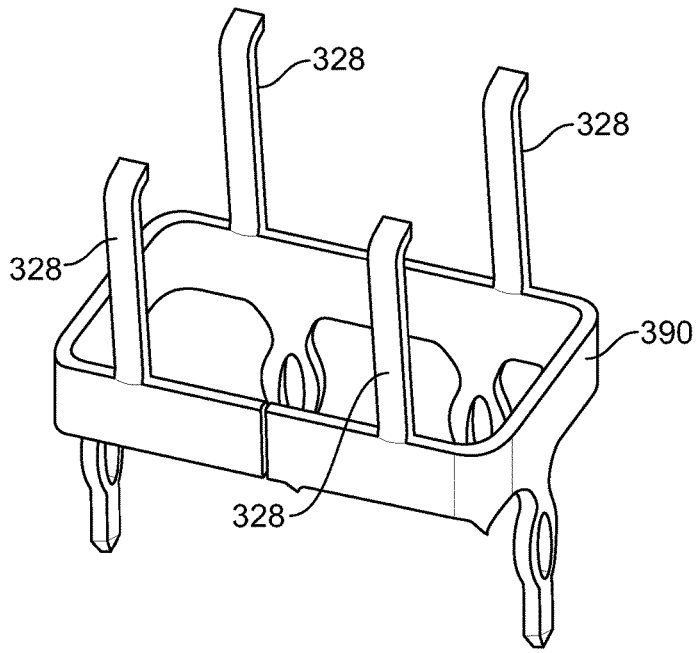
FIG. 22
FIG. 23

CIRCUIT CARD ASSEMBLIES FOR A COMMUNICATION SYSTEM

CROSS REFERENCE TO RELATED APPLICATIONS

This application claims benefit to U.S. Provisional Application No. 62/543,084, filed Aug. 9, 2017, titled "CIRCUIT CARD ASSEMBLIES FOR A COMMUNICATION SYSTEM", the subject matter of which is herein incorporated by reference in its entirety.

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system.

A need remains for a cost effective and reliable communication system allowing airflow through the communication system for cooling the electrical components.

BRIEF DESCRIPTION OF THE INVENTION

In one embodiment, a communication system is provided including a first circuit card assembly having a first printed circuit board (PCB) and a first electrical connector. The first PCB includes a first slot extending rearward from a first mating edge of the first PCB. The first electrical connector is mounted to the first PCB along the first slot. The first electrical connector has a first mating end and first contacts at the first mating end. Each of the first contacts have a first mating interface. The communication system includes a second circuit card assembly having a second PCB and a second electrical connector. The second PCB has a second mating edge. The second electrical connector is mounted to the second PCB proximate to the mating edge. The second electrical connector has a second mating end and second contacts at the second mating end. Each of the second contacts has a second mating interface. The first and second circuit card assemblies are mated during a board mating stage such that the first PCB and the second PCB move relative to each other along a board mating axis parallel to the first slot with the first PCB oriented perpendicular to the second PCB and with the first and second mating ends of the first and second electrical connectors being oriented parallel to the board mating axis. The second mating edge of the second PCB is received in the first slot to align the second mating end of the second electrical connector with the first mating end of the first electrical connector for mating the second electrical connector with the first electrical connector. The first and second circuit card assemblies are mated during a connector mating stage such that the first electrical connector and the second electrical connector move relative to each other along a connector mating axis perpendicular to the board mating axis. The first mating interfaces of the first contacts are mated to the second mating interfaces of the corresponding second contacts in a contact mating direction non-parallel to the board mating axis and non-parallel to the connector mating axis.

In another embodiment, a circuit card assembly for a communication system is provided including a printed circuit board (PCB) having a first surface and a second surface extending along a primary axis and a secondary axis. The PCB has a mating edge between the first and second surfaces generally parallel to the secondary axis. The PCB has a mounting area on the first surface adjacent the mating edge. The circuit card assembly includes an electrical connector mounted to the first surface at the mounting area. The electrical connector has a housing extending between a front and a rear. The front is provided proximate to the mating edge. The electrical connector has a mounting end extending between the front and the rear being mounted to the mounting area. The electrical connector has a mating end extending between the front and the rear generally parallel to the primary axis. The mating end is configured to be mated to a mating electrical connector. The electrical connector has contacts held by the housing being terminated to the PCB. Each contact has a mating beam extending along a beam axis between a base and a tip. The mating beam includes an interior face defining a mating interface for mating with a mating contact of the mating electrical connector. The interior face extends between a leading end and a trailing end of the mating beam. Each contact is configured to be mated with the mating contact in a contact mating direction non-parallel to the beam axis.

In a further embodiment, a communication system is provided including a first circuit card assembly and a second circuit card assembly. The first circuit card assembly includes a first printed circuit board (PCB) and a first electrical connector mounted to the first PCB, the first PCB having a first surface and a second surface extending along a primary axis and a secondary axis, the first PCB having a first mating edge between the first and second surfaces generally parallel to the secondary axis of the first PCB, the first PCB having a first slot between the first and second surfaces open at the first mating edge and extending a length generally along the primary axis of the first PCB, the first PCB having a first mounting area on the first surface adjacent the first slot with the first electrical connector mounted to the first mounting area, the first electrical connector having a front and a rear opposite the front, a mounting end extending between the front and the rear being mounted to the mounting area, and a mating end extending between the front and the rear generally parallel to the primary axis of the first PCB, the first electrical connector having first contacts including mating ends at the mating end of the first electrical connector and terminating ends at the mounting end of the first electrical connector terminated to the first PCB, each of the first contacts having a first mating interface. The second circuit card assembly includes a second PCB and a second electrical connector mounted to the second PCB, the second PCB having a first surface and a second surface extending along a primary axis and a secondary axis, the second PCB having a second mating edge between the first and second surfaces generally parallel to the secondary axis of the second PCB, the second PCB having a second mounting area on the first surface proximate to the second mating edge with the second electrical connector mounted to the second mounting area, the second electrical connector having a front and a rear opposite the front, a mounting end extending between the front and the rear being mounted to the mounting area, and a mating end extending between the front and the rear generally parallel to the primary axis of the second PCB, the second electrical connector having second contacts including mating ends at the mating end of the second electrical connector and terminating ends at the mounting end of the second electrical connector terminated to the second PCB, each of the second contacts having a second mating interface, the second mating edge of the second PCB being received in the first slot to align the mating end of the second electrical connector with the mating end of the first electrical connector. The first and second circuit card assemblies are mated during a board mating stage such that the first PCB and the second PCB move relative to each other along a board mating axis parallel to the first slot with the first PCB oriented perpendicular to the second PCB and with the first and second mating ends of the first and second electrical connectors being oriented parallel to the board mating axis, the second mating edge of the second PCB being received in the first slot to align the second mating end of the second electrical connector with the first mating end of the first electrical connector for mating the second electrical connector with the first electrical connector. The first and second circuit card assemblies are mated during a connector mating stage such that the first electrical connector and the second electrical connector move relative to each other along a connector mating axis perpendicular to the board mating axis. The first mating interfaces of the first contacts are mated to the second mating interfaces of the corresponding second contacts in a contact mating direction non-parallel to the board mating axis and non-parallel to the connector mating axis.

BRIEF DESCRIPTION OF THE DRAWINGS

FIG. 5 is a perspective view of a portion of the communication system showing the first circuit card assembly and the second circuit card assembly poised for mating.

FIG. 6 is a perspective view of a portion of the communication system in accordance with an exemplary embodiment.

FIG. 7 is a perspective view of a portion of the communication system in accordance with an exemplary embodiment.

FIG. 19 is a perspective view of a portion of the connector system showing one of the contacts formed in accordance with an exemplary embodiment.

FIG. 20 is a perspective view of a portion of the connector system showing one of the contacts formed in accordance with an exemplary embodiment.

FIG. 21 is a perspective view of a portion of the connector system showing one of the contacts formed in accordance with an exemplary embodiment.

FIG. 22 is a perspective view of one of the contacts formed in accordance with an exemplary embodiment.

FIG. 23 is a perspective view of the contacts formed in accordance with an exemplary embodiment.

DETAILED DESCRIPTION OF THE INVENTION

Figure 1:
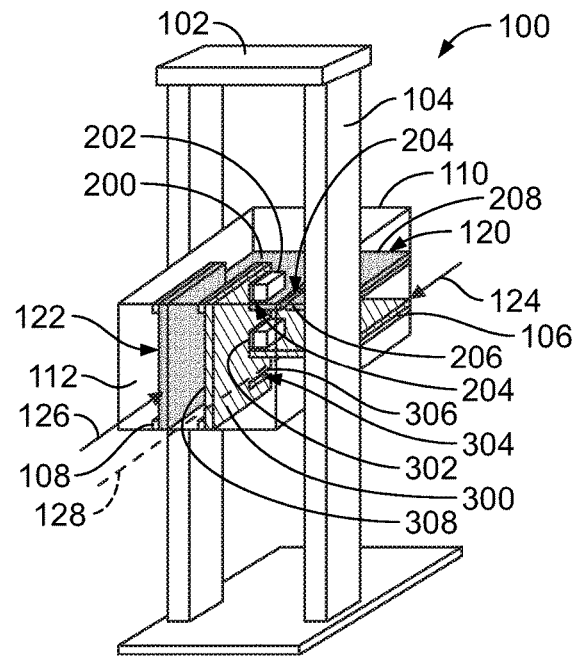
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
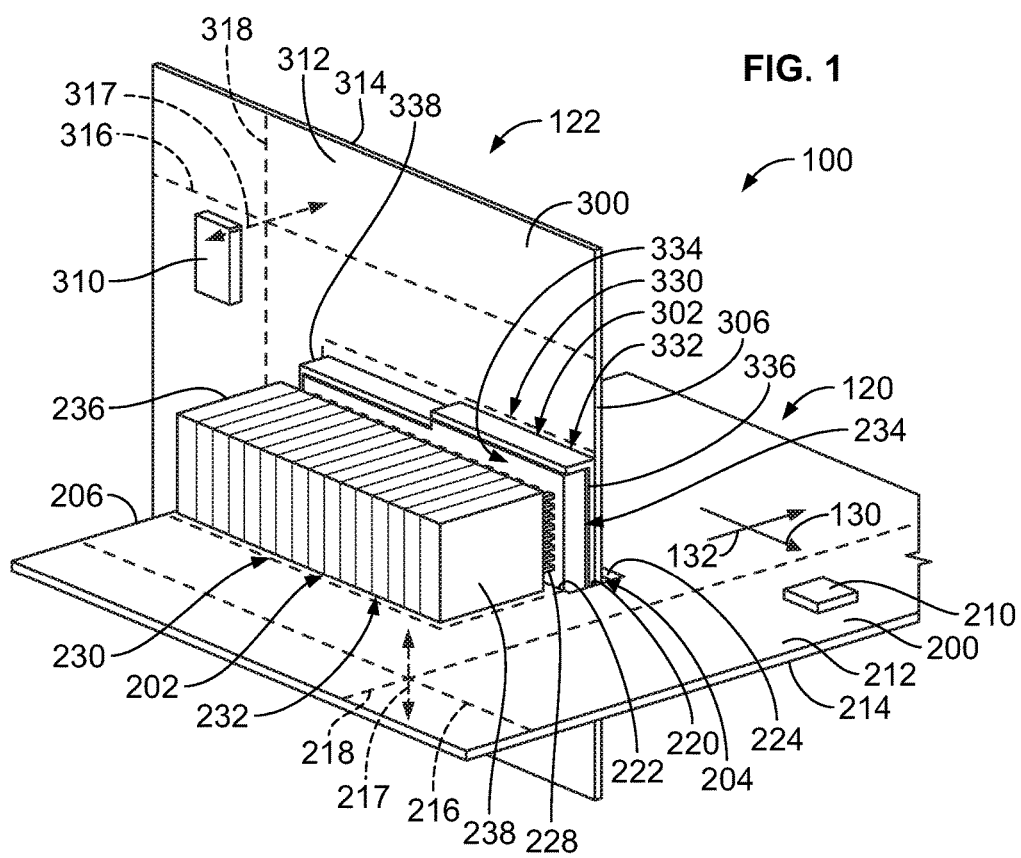
FIG. 2 is a perspective view of a portion of the communication system showing a first circuit card assembly coupled to a second circuit card assembly.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 thereon. For example, the electrical components 210 (such as shown in FIG. 2) may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a mating direction perpendicular to the loading directions 124, 126. In an exemplary embodiment, the contacts of the first and second electrical connectors 202, 302 are configured to allow mating in an angled direction, such as due to loading of the first and second PCB(s) 200, 300 and mating of the first and second electrical connectors 202, 302. For example, the first and second PCBs 200, 300 may be loaded in a board loading direction 130 (shown in FIG. 2), while the first and second electrical connectors 202, 302 are mated in a connector mating direction 132 (shown in FIG. 2), perpendicular to the board loading direction 130 causing the contacts to be mated in a direction non-parallel to the board loading direction 130 and non-parallel to the connector mating direction 132.

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The arrangement may allow the PCBs 200, 300 to overlap to reduce one or more dimensions of the communication system 100, such as a front to rear length of the communication system 100.

Figure 3:
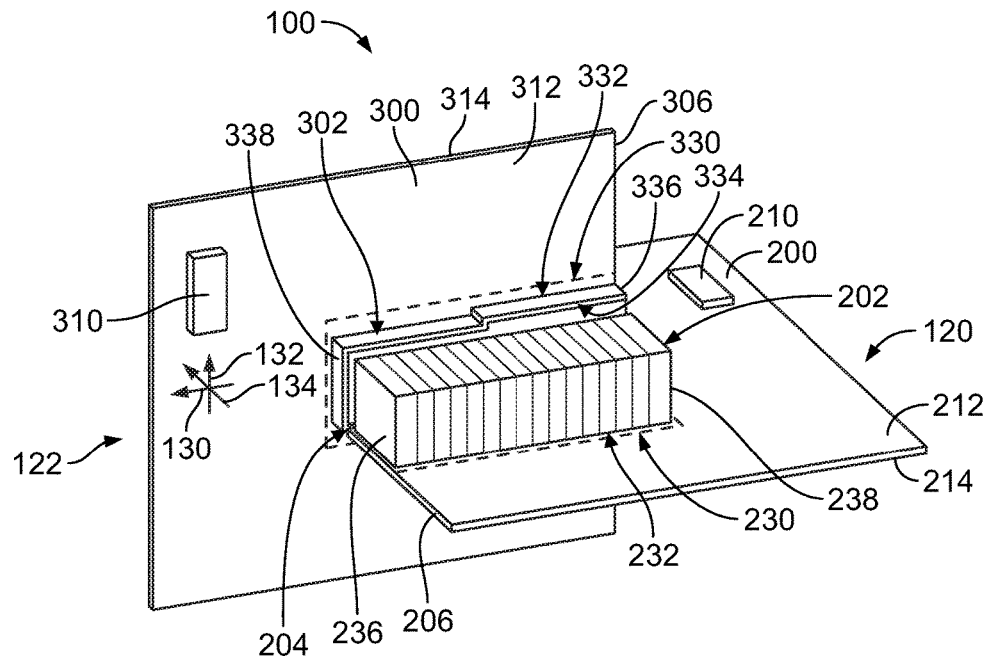
FIG. 3 is a perspective view of a portion of the communication system showing the first circuit card assembly coupled to the second circuit card assembly.
Figure 4:
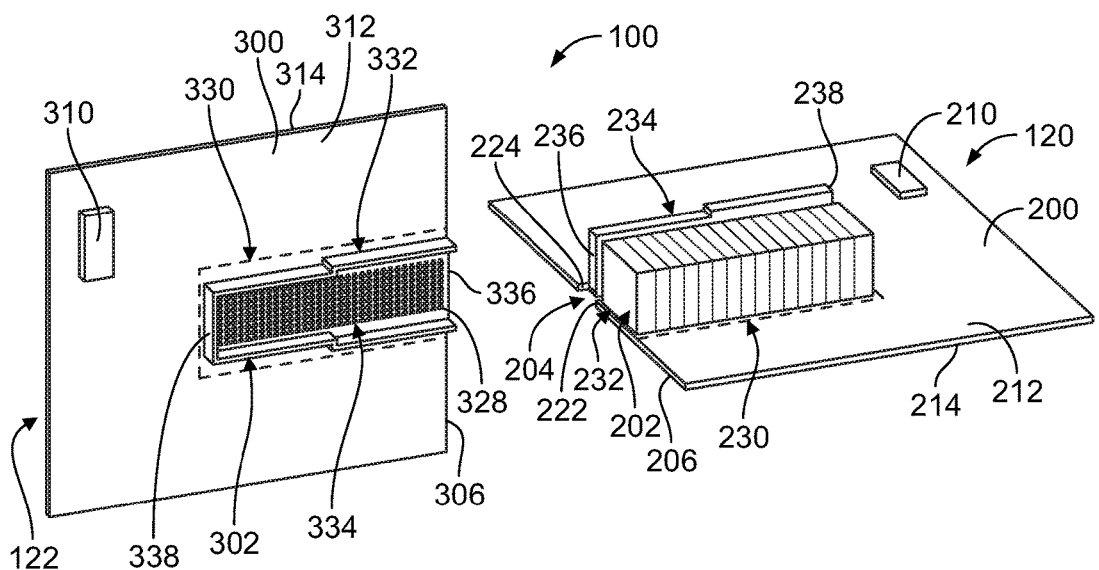
FIG. 4 is a perspective view of a portion of the communication system showing the first circuit card assembly and the second circuit card assembly poised for mating.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a perspective view of a portion of the communication system 100 showing the first circuit card assembly 120 coupled to the second circuit card assembly 122. FIG. 4 is a perspective view of a portion of the communication system 100 showing the first circuit card assembly 120 and the second circuit card assembly 122 poised for mating. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the first PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 (shown in FIGS. 4 and 5) remote from the mating edge 206. The first slot 204 has first and second side edges 222, 224 extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the first PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, a portion of the second PCB 300 is configured to be received in the first slot 204 that may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends along the mating edge 306 a distance. The electrical connector 302 is terminated to the PCB 300 at the mounting area 330. For example, contacts 328 of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 and a rear 338 opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. During mating, the contacts 228 and/or 328 are moved in a board loading direction 130 (for example, parallel to the primary axes 216, 316 of the PCBs 200, 300) and in a connector mating direction 132 (for example, sideways or perpendicular to the board loading direction 130) as the first and second electrical connectors 202, 302 are moved toward each other. Such compound movements cause the contacts 228, 328 to be mated at an angle along a contact mating direction 134 (shown in FIG. 14) that is non-parallel to the board loading direction and that is non-parallel to the connector mating direction.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
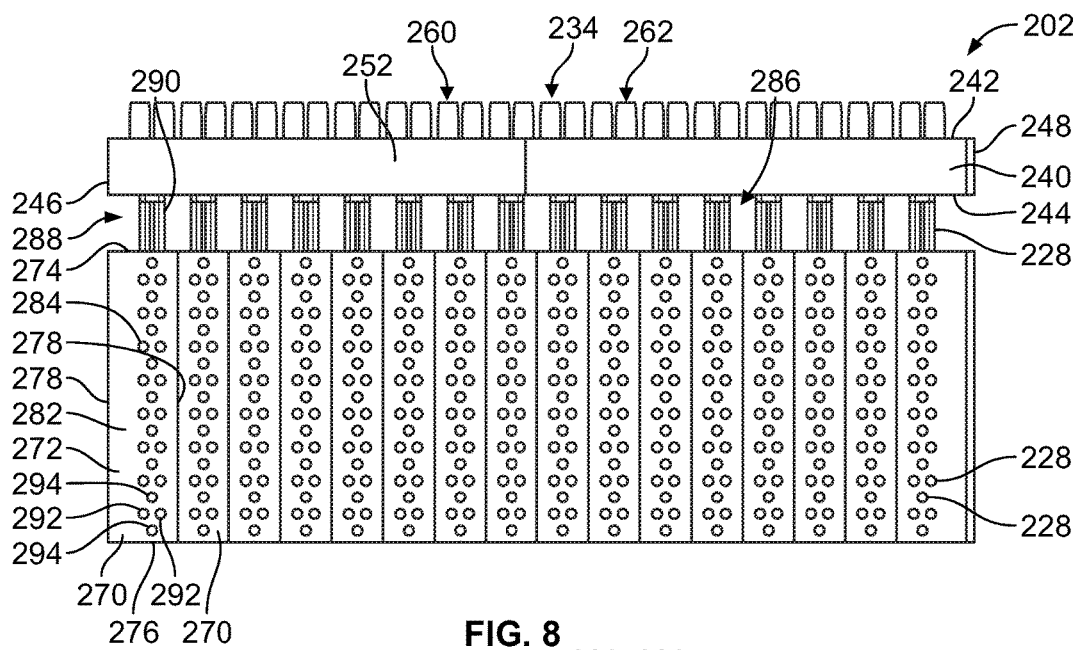
FIG. 8 is a bottom view of a first electrical connector of the first circuit card assembly in accordance with an exemplary embodiment.
Figure 9:
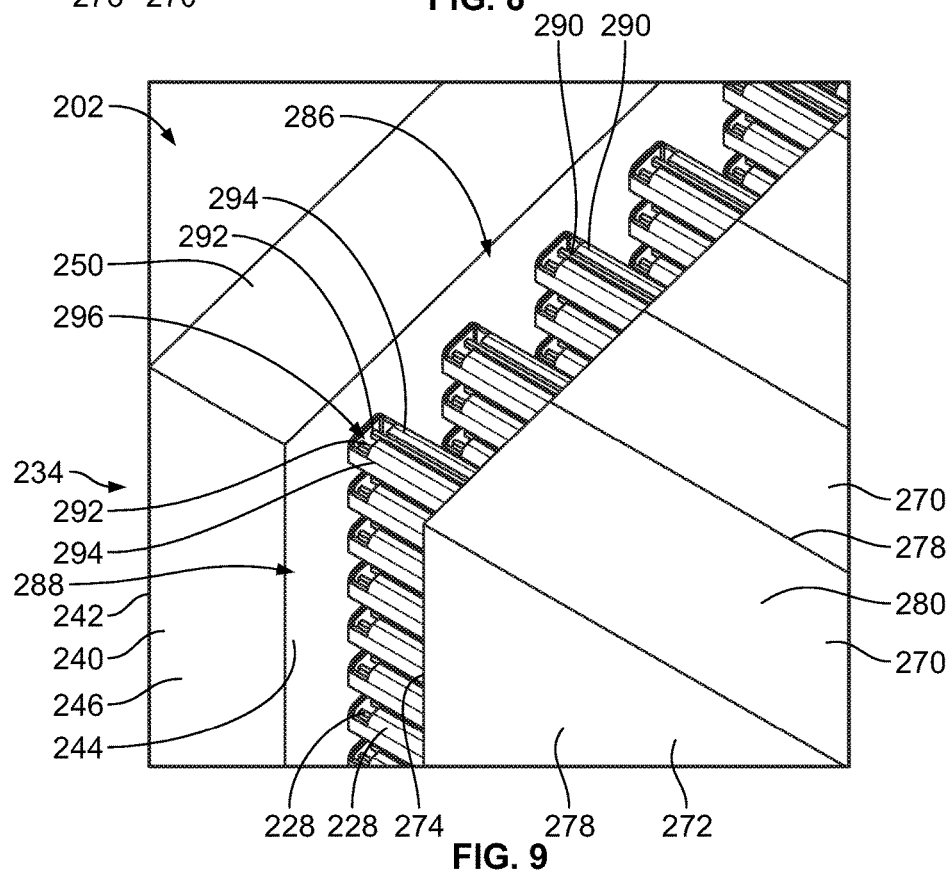
FIG. 9 is a perspective view of a portion of the first electrical connector in accordance with an exemplary embodiment.
Figure 10:
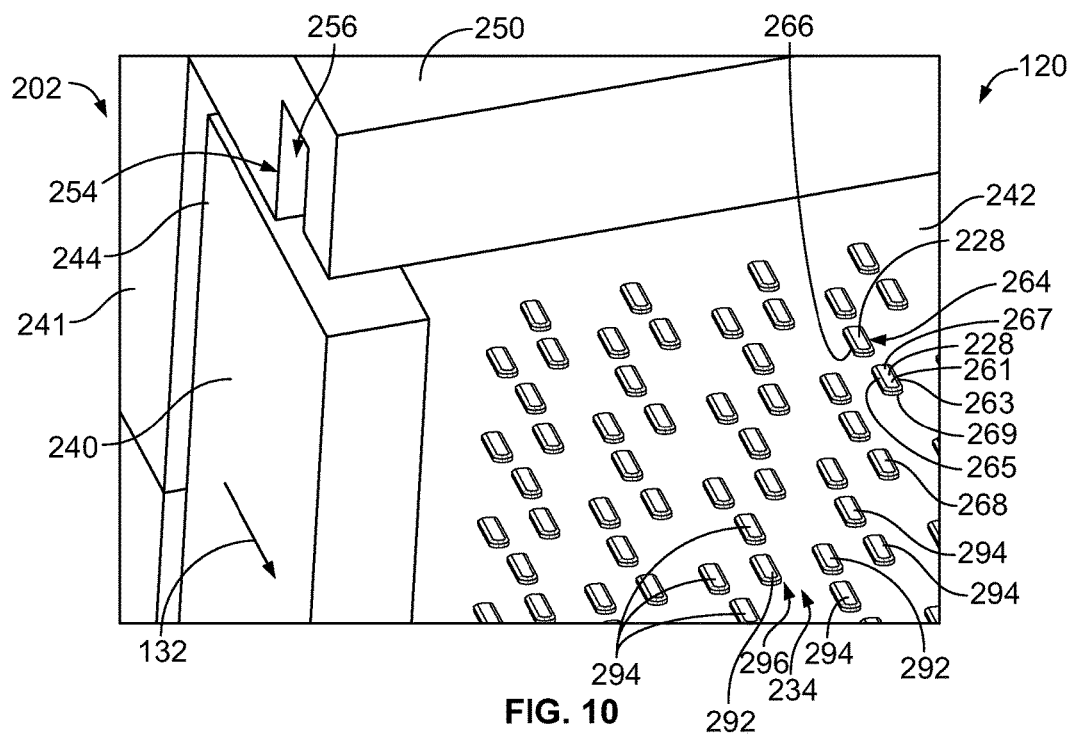
FIG. 10 is an end view of a portion of the first electrical connector in accordance with an exemplary embodiment.
Figure 11:
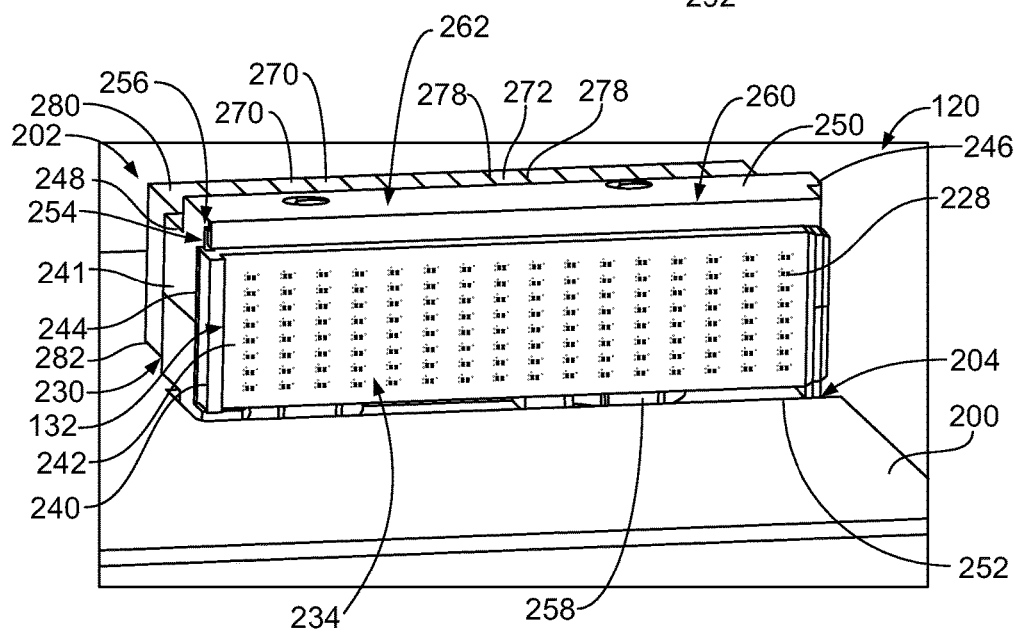
FIG. 11 is a top perspective view of a portion of the first circuit card assembly showing the first electrical connector mounted to a first PCB.

FIG. 8 is a bottom view of the first electrical connector 202 in accordance with an exemplary embodiment. FIG. 9 is a perspective view of a portion of the first electrical connector 202 in accordance with an exemplary embodiment. FIG. 10 is an end view of a portion of the first electrical connector 202 in accordance with an exemplary embodiment. FIG. 11 is a top perspective view of a portion of the first circuit card assembly 120 showing the first electrical connector 202 mounted to the first PCB 200 at the mounting area 230 adjacent the first slot 204.

In an exemplary embodiment, the first electrical connector 202 includes a mating housing 240 at the mating end 234 and a shell 241 (FIGS. 10 and 11) surrounding at least a portion of the mating housing 240. The shell 241 is not illustrated in FIGS. 2-9 to illustrate other components of the electrical connector 202 and may be an optional component. Optionally, the mating housing 240 may be movable within the shell 241, such as in the connector mating direction 132. The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds the contacts 228 for mating with the second electrical connector 302 (shown in FIG. 2). For example, each of the contacts 228 includes a mating end 264 (FIG. 10) extending beyond the first side 242 for mating with the second electrical connector 302. The mating ends 264 are provided at the first side 242 in a predetermined layout for mating with the second electrical connector 302.

In the illustrated embodiment, the mating ends 264 are planar blades (FIG. 10) at the first side 242. Each mating end 264 has sides 261 extending between a leading edge 263 and a trailing edge 265. The sides 261 are wider than the edges 263, 265. The mating end 264 has a mating interface 266 (FIG. 10) at one or both of the sides 261 configured to engage the mating contact 328 (shown in FIG. 4) when mated thereto. The mating ends 264 extend along blade axes 268 between bases 267 and tips 269 at distal ends of the blades. Other types of mating ends may be provided in alternative embodiments, such as spring beams, pins, sockets, and the like.

The electrical connector 202 includes a top 250 and a bottom 252. In an exemplary embodiment, the top 250 and the bottom 252 include connecting elements 254 (FIG. 11) for connecting the first electrical connector 202 to the second electrical connector 302. In the illustrated embodiment, the connecting elements 254 are defined by grooves 256 in the shell 241 at the top 250 and the bottom 252 configured to receive portions of the second electrical connector 302. The connecting elements 254 secure the shell 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

Optionally, the electrical connector 202 may include cam levers 258 (FIG. 11) at the top 250 and the bottom 252 for actuating the mating housing 240 relative to the shell 241 during mating. The cam levers 258 may be held by the shell 241 and operably coupled to the mating housing 240 to move the mating housing 240 sideways in the connector mating direction 132. The cam levers 258 may be actuated by the second electrical connector 302 as the first and second electrical connectors 302 are coupled together. For example, actuators, such as ramps, may be provided on the second electrical connector 302 to actuate the cam levers 258 as the cam levers slide along the ramps. In an exemplary embodiment, multiple cam levers 258 are provided, such as at a front section 260 and a rear section 262 of the electrical connector 202.

In an exemplary embodiment, the electrical connector 202 includes contact modules 270 each holding a plurality of the contacts 228. The contact modules 270 may be coupled to the shell 241 and/or the mating housing 240, such as at the second side 244. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228.

The contact modules 270 each have a first side 274 facing the mating housing 240 and a second side 276 opposite the first side 274. The contact module 270 includes sides 278 facing each other when the contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (shown in FIG. 2). Optionally, portions of the contacts 228 may extend below the bottom 282 for termination to the first PCB 200. For example, each of the contacts 228 may include a terminating end 284 (FIG. 8) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302. For example, the contact modules 270 may not engage the mating housing 240 in various embodiments. Rather, a gap 288 may be provided between the first sides 274 of the contact modules 270 and the second side 244 of the mating housing 240. The contacts 228 may span the gap 288 between the contact modules 270 and the mating housing 240. The contacts 228 include flexible sections 290 between the mating ends 264 and the terminating ends 284 to allow relative movement of the contacts 228 and the mating housing 240. The flexible sections 290 may be defined by sections of the contacts 228 that are not encased or enclosed by the dielectric body 272 and/or do not extend through the mating housing 240. For example, the flexible sections 290 may be located in the gap 288. Optionally, the flexible sections 290 may be enclosed or shrouded by a portion of the electrical connector 202, such as a shroud extending from the second side 244 of the mating housing 240 or a separate housing component.

In an exemplary embodiment, the contacts 228 include signal contacts 292 and ground contacts 294. Optionally, the signal contacts 292 may be arranged in pairs 296 configured to convey differential signals. The ground contacts 294 are interspersed with the signal contacts 292 to provide electrical shielding for the signal contacts 292. For example, the ground contacts 294 may be provided between the pairs 296 of signal contacts 292. Optionally, the ground contacts 294 may be provided above, below, and/or between the various pairs 296 of signal contacts 292. The signal contacts 292 and/or the ground contacts 294 may be stamped and formed contacts.

As shown in FIG. 11, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections 290 of the contacts 228 defining the compliant section 286 of the electrical connector 202 allow the mating housing 240 to move relative to the PCB 200 during mating with the second electrical connector 302.

Figure 12:
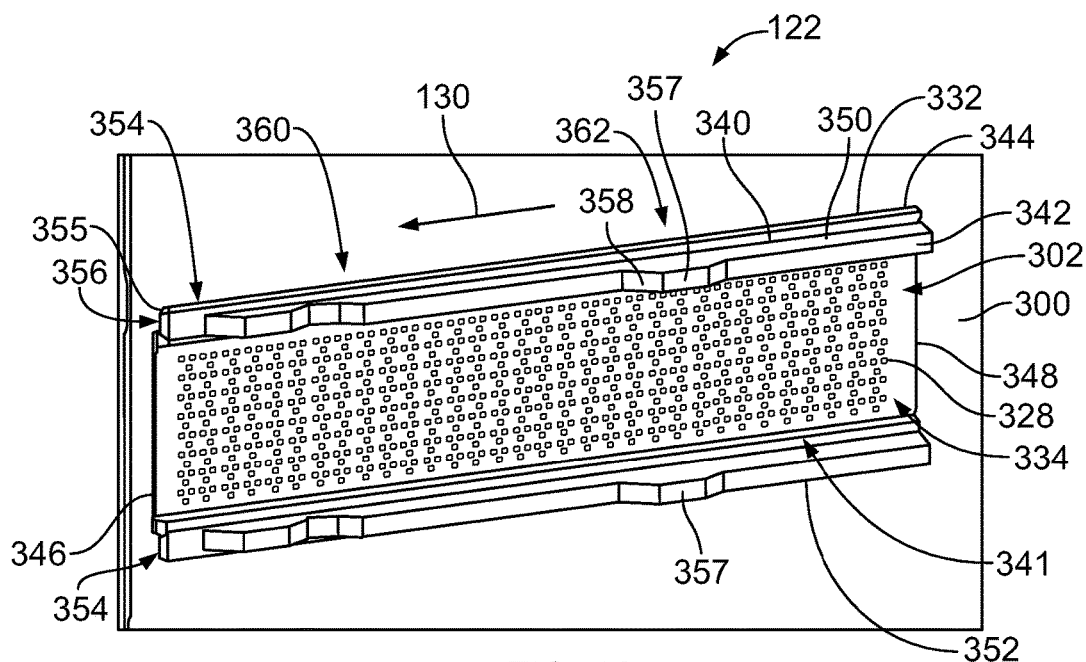
FIG. 12 is a perspective view of a portion of the second circuit card assembly in accordance with an exemplary embodiment.
Figure 13:
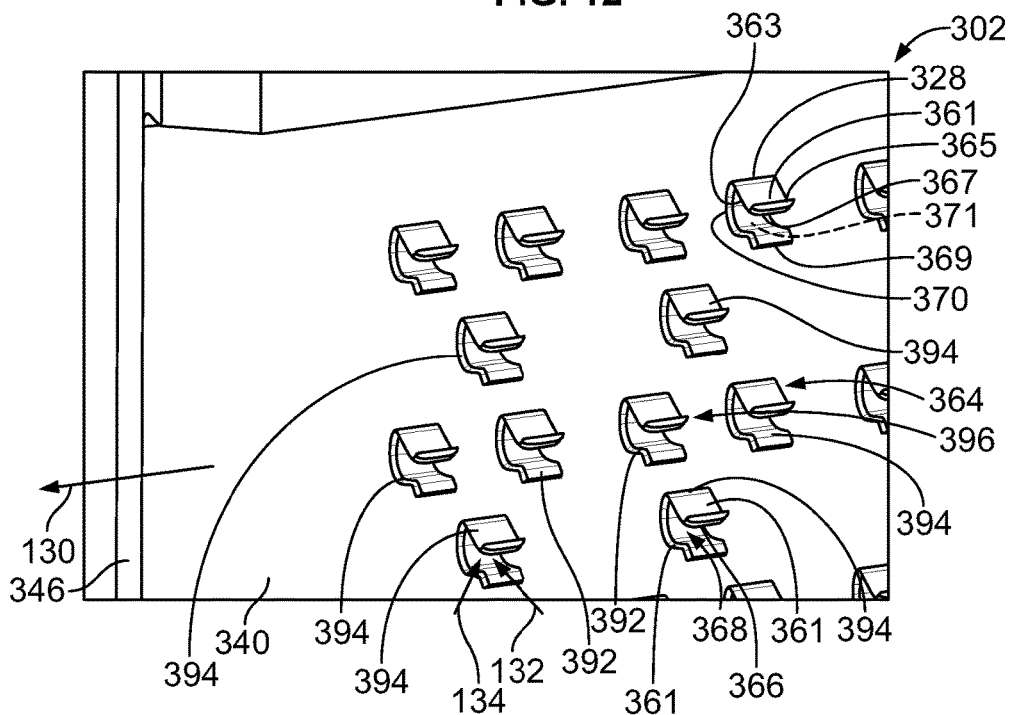
FIG. 13 is a perspective view of a portion of the second electrical connector in accordance with an exemplary embodiment.

FIG. 12 is a perspective view of a portion of the second circuit card assembly 122 in accordance with an exemplary embodiment. FIG. 13 is a perspective view of a portion of the second electrical connector 302 in accordance with an exemplary embodiment. In an exemplary embodiment, the electrical connector 302 includes a housing 340 holding the contacts 328. The housing 340 includes walls defining a cavity 341 configured to receive the mating housing 240 of the first electrical connector 202 (both shown in FIG. 11).

The housing 340 includes a first side 342, a second side 344, a front 346 and a rear 348. The first side 342 defines the mating end 334 of the electrical connector 302. The mating end 334 is oriented parallel to the second PCB 300. In an exemplary embodiment, the housing 340 holds the contacts 328 for mating with the first electrical connector 202. For example, each of the contacts 328 includes a mating end 364 (FIG. 13) exposed at or beyond the first side 342 for mating with the first electrical connector 202. The mating ends 364 are provided at the first side 342 in a predetermined layout for mating with the first electrical connector 202. The mating end 364 includes one or more mating beams 361 extending between a leading end 363 and a trailing end 365. The mating beam 361 has a mating interface 366 at an interior face 367 of the mating beam 361. In the illustrated embodiment, the mating end 364 has a pair of mating beams 361 defining a socket 368 that is open at the leading ends 363 for receiving the contact 228 and that is open at tips 369 of the mating beams 361 at distal ends thereof for receiving the contact 228. Each mating beam 361 extends from the tip 369 to a base 370. Optionally, the mating beams 361 may meet or converge at the bases 370. Each mating beam 361 extends generally along a beam axis 371 between the base 370 and the tip 369. The mating beam 361 may be curved between the base 370 and the tip 369 to define the mating interface 366. The mating beam 361 may be deflectable for mating with the first contact 228. Other types of mating ends may be provided in alternative embodiments having different shapes. The mating beam 361 is configured for mating at an angle, non-parallel to the beam axis 371, such as in the contact mating direction 134 due to the PCBs 200, 300 moving in the board loading direction 130 and the first electrical connector 202 mating in the connector mating direction 132. Optionally, the contact mating direction 134 may be at an angle of between approximately 30° and 60° relative to the beam axis 371. The compound movements of the first and second electrical connectors 202, 302 causes the contacts 228 to be mated non-parallel to the beam axes 371. The contacts 228 may be loaded into the socket 368 through the leading end 363 and through the tip 369. The contacts 228 may slide sideways within and slide downward into the sockets 368 during mating.

The housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include pockets 356 defined by ledges 355 at the top 350 and the bottom 352. The pockets 356 are configured to receive corresponding connecting elements 254 (shown in FIG. 11) of the first electrical connector 202. The ledges 355 are configured to be received in corresponding grooves 256 (shown in FIG. 11). Other types of connecting elements 354 may be provided in alternative embodiments, such as pins, clips, fasteners, and the like.

The housing 340 includes actuators 357 at the first side 342 configured to actuate the cam levers 258 (shown in FIG. 11). The actuators 357 include ramp surfaces 358 that engage the cam levers and actuate the cam levers 258 as the cam levers 258 ride along the housing 340 during mating of the first and second electrical connectors 202, 302. In the illustrated embodiment, the housing 340 includes multiple actuators 357 laterally spaced apart, such as for actuating multiple cam levers 258. For example, the housing 340 may include actuators 357 along both the top 350 and the bottom 352 at both a front section 360 and a rear section 362 of the housing 340. Optionally, the actuators 357 may be at different heights, such as shorter at the front section 360 and taller at the rear section 362 to allow actuation of different cam levers 258.

The housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, the contacts 328 include signal contacts 392 and ground contacts 394. Optionally, the signal contacts 392 may be arranged in pairs 396 configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs 396 of signal contacts 392.

Figure 14:
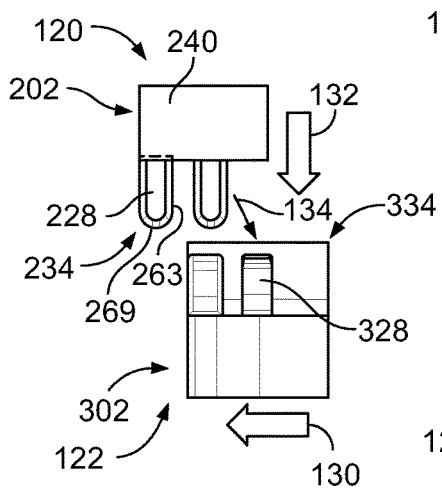
FIG. 14 shows a portion of the second circuit card assembly poised for mating with the first circuit card assembly.
Figure 15:
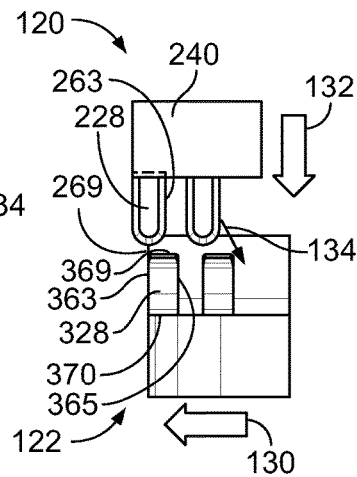
FIG. 15 shows a portion of the second circuit card assembly partially mated with the first circuit card assembly.
Figure 16:
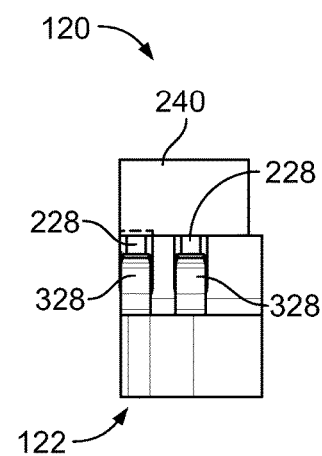
FIG. 16 shows a portion of the second circuit card assembly fully mated with the first circuit card assembly.

FIGS. 14-16 illustrate a mating sequence of the contacts 228, 328 of the first circuit card assembly 120 and the second circuit card assembly 122. FIG. 14 shows a portion of the second circuit card assembly 122 partially mated with the first circuit card assembly 120 prior to the first electrical connector 202 moving in the connector mating direction 132. FIG. 15 shows a portion of the second circuit card assembly 122 partially mated with the first circuit card assembly 120. FIG. 16 shows the second circuit card assembly 122 fully mated with the first circuit card assembly 120. While the mating sequence is described as the first circuit card assembly 120 being fixed and the second circuit card assembly 122 being moved into position relative to the first circuit card assembly 120, it should be realized that in alternative embodiments, the second circuit card assembly 122 may be fixed and the first circuit card assembly 120 may be moved into position relative to the second circuit card assembly 122.

During mating, the second circuit card assembly 122 is aligned with the first circuit card assembly 120 (for example, with the first slot 204). The second PCB 200 is slid or loaded in the board loading direction 130 parallel to the first slot 204. When mated, the first PCB 200 is oriented perpendicular to the second PCB 300 (see FIG. 2) and both PCBs 200, 300 are aligned in the board loading direction 130. As such, air is able to flow past the circuit card assemblies 120, 122 with minimal interference from either PCB 200, 300. The electrical connectors 202, 302 are elongated to reduce the cross-sectional area of the electrical connectors 202, 302 to reduce blocking of the airflow. The first and second mating ends 234, 334 of the first and second electrical connectors 202, 302 are oriented parallel to the board loading direction 130.

As the second electrical connector 202 is moved forward in the board loading direction 130 relative to the first electrical connector 202, the second contacts 328 are also moved forward in the board loading direction 130. At some point during the loading, the first electrical connector 202 is moved toward the second electrical connector 302 in the connector mating direction 132. For example, when the actuators 357 (FIG. 13) engage the cam levers 258, the mating housing 240 is driven sideways in the connector mating direction 132 relative to the second electrical connector 302. The first contacts 228 are also moved sideways in the connector mating direction 132 relative to the second contacts 328 with the mating housing 240. As such, during mating, the first contacts 228 are moving sideways in the connector mating direction 132 and the second contacts 328 are moving forward in the board loading direction 130 simultaneously. The relative, compound movement of the first and second contacts 228, 328 cause mating of the contacts 228, 328 in the contact mating direction 134, which is non-parallel to the board loading direction 130 and non-parallel to the connector mating direction 132. The contacts 228, 328 are mated at an angle. During mating, the leading edges 263 of the contacts 228 are passing the leading ends 363 of the contacts 328 and moving toward the trailing ends 365 of the contacts 328 and the tips 269 of the contacts 228 are passing the tips 369 of the contacts 328 and moving toward the bases 370 of the contacts 328.

Figure 17:
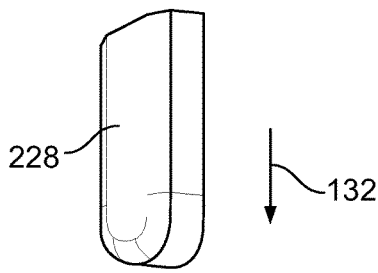
FIG. 17 is a perspective view of a portion of the connector system showing the contacts formed in accordance with an exemplary embodiment.
Figure 17:
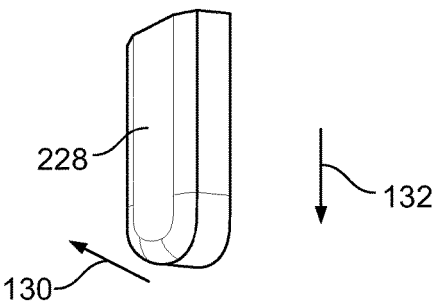
Figure 17:
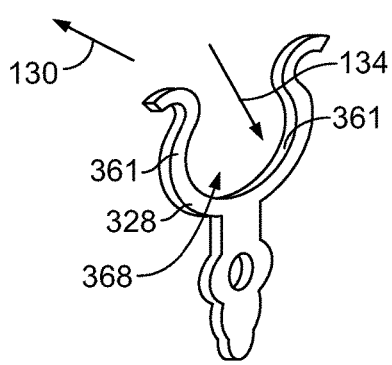

FIG. 17 is a perspective view of a portion of the connector system 100 showing the first contact 228 configured to be coupled to the second contact 328 formed in accordance with an exemplary embodiment. The second contact 328 in the illustrated embodiment is similar to the second contact 328 shown in FIG. 13; however, the second contact 328 in the illustrated embodiment is stamped from a flat blank of material into a tulip shape as opposed to being stamped and formed. The second contact 328 is illustrated including two mating beams 361 defining the socket 368. The first contact 228 is configured to be received in the socket 368 in the board loading direction 130 and the connector mating direction 132 at an angled contact mating direction 134.

Figure 18:
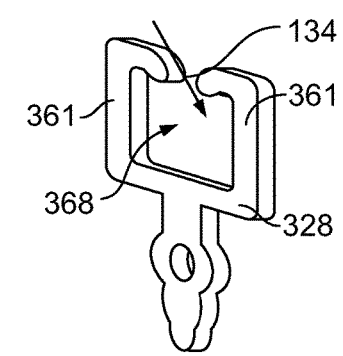
FIG. 18 is a perspective view of a portion of the connector system showing the contacts formed in accordance with an exemplary embodiment.

FIG. 18 is a perspective view of a portion of the connector system 100 showing the first contact 228 configured to be coupled to the second contact 328 formed in accordance with an exemplary embodiment. The second contact 328 in the illustrated embodiment is similar to the second contacts 328 shown in FIGS. 13 and 17. The second contact 328 is illustrated including two mating beams 361 bent in opposite direction to define the socket 368. The first contact 228 is configured to be received in the socket 368 between the mating beams 361 in the board loading direction 130 and the connector mating direction 132 at an angled contact mating direction 134.

FIG. 19 is a perspective view of a portion of the connector system 100 showing the second contact 328 formed in accordance with an exemplary embodiment. The second contact 328 in the illustrated embodiment is similar to the second contact 328 shown in FIG. 13; however, the second contact 328 in the illustrated embodiment includes lead-in features 386 at the leading ends 363 of the mating beams 361. The lead-in features 386 guide the first contact 228 into the socket 368. The second contact 328 in the illustrated embodiment includes a stop feature 388 at the trailing end 365 of one of the mating beams 361. The stop features 388 retain the first contact 228 in the socket 368. For example, the leading edge 263 is configured to engage the stop feature 388 to stop further movement in the board loading direction 130.

FIG. 20 is a perspective view of a portion of the connector system 100 showing the second contact 328 formed in accordance with an exemplary embodiment. The second contact 328 in the illustrated embodiment is similar to the second contact 328 shown in FIG. 13; however, the socket 368 of the second contact 328 in the illustrated embodiment is oriented 90° relative to the orientation shown in the embodiment in FIG. 13. The tips 369 receive the first contact 228 in the board loading direction 130 and the leading end 363 receives the first contact 228 in the connector mating direction 132.

FIG. 21 is a perspective view of a portion of the connector system 100 showing the second contact 328 formed in accordance with an exemplary embodiment. The second contact 328 in the illustrated embodiment is similar to the second contact 328 shown in FIG. 13; however, the second contact 328 in the illustrated embodiment is stamped and formed into a different shape. The second contact 328 is illustrated including two mating beams 361 with the bases 370 extending vertically and the tips 369 extending horizontally. The tips 369 receive the first contact 228 in the board loading direction 130 and the first contact 228 is free to move in the connector mating direction 132 between the mating beams 361. The second contact 328 in the illustrated embodiment includes the stop feature 388 to stop further movement in the board loading direction 130.

FIG. 22 is a perspective view of the second contact 328 formed in accordance with an exemplary embodiment. The second contact 328 in the illustrated embodiment is similar to the second contact 328 shown in FIG. 13; however, the second contact 328 in the illustrated embodiment includes a single mating beam 361 rather than a pair of mating beams 361. The tip 369 is flared outward for receiving the first contact 228 in the connector mating direction 132. Optionally, the leading end 363 may be curved for receiving the first contact 228 in the board loading direction 130. Optionally, the second contact 328 may include one of the guide features (not shown, similar to the guide features 386 shown in FIG. 19) at the leading end 363.

FIG. 23 is a perspective view of second contacts 328 formed in accordance with an exemplary embodiment. The second contacts 328 in the illustrated embodiment are similar to the second contact 328 shown in FIG. 22; however, multiple second contacts 328 are shown in the illustrated embodiment connected by a commoning member 390. The second contacts 328 and the commoning member 390 may be used as ground contacts to surround a pair of signal contacts.

Figure 24:
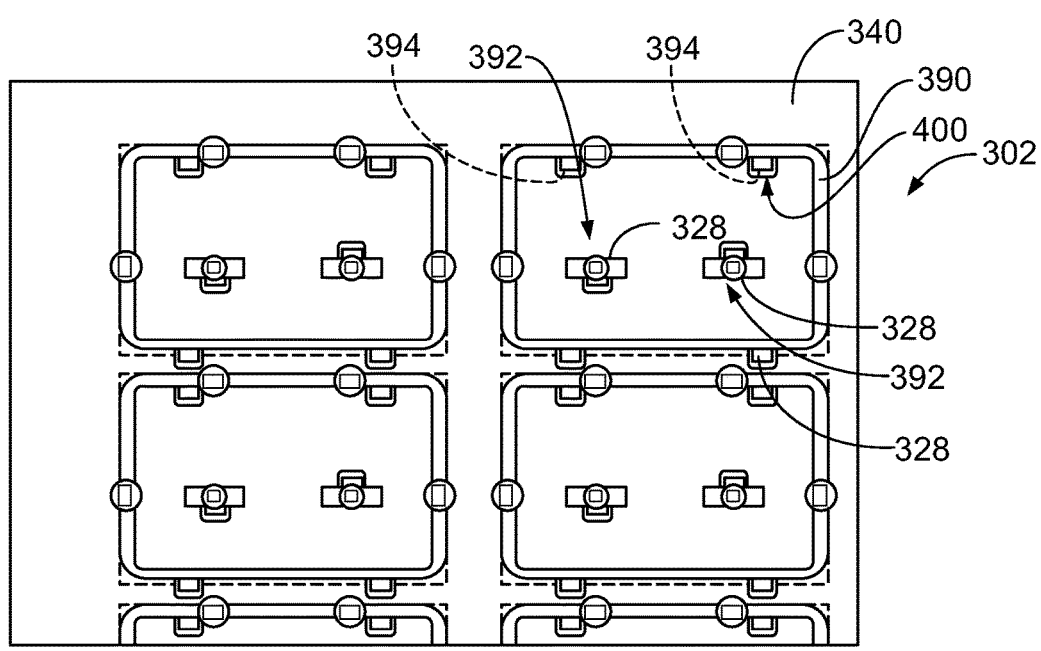
FIG. 24 is a bottom view of a portion of the second electrical connector showing the housing holding the contacts.

FIG. 24 is a bottom view of a portion of the second electrical connector 302 showing the housing 340 holding a plurality of the second contacts 328. In the illustrated embodiment, the signal contacts 392 are arranged in pairs and surrounded by the ground contacts 394 that are connected by the commoning member 390. The contacts 328 are held in contact channels 400 in the housing 340.

Figure 25:
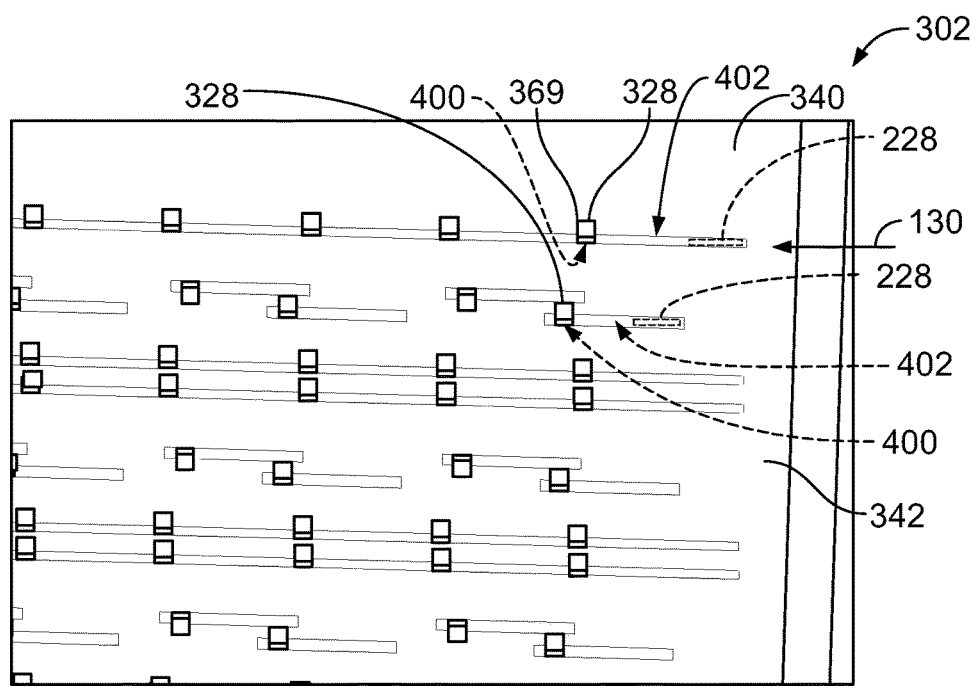
FIG. 25 is a top view of a portion of the second electrical connector showing the housing holding the contacts.

FIG. 25 is a top view of a portion of the second electrical connector 302 showing the housing 340 holding a plurality of the second contacts 328. The second contacts 328 are arranged in the contact channels 400. The housing 340, in an exemplary embodiment, extends substantially the entire length of the second contacts 328 such that the mating beams 361 are surrounded by the housing 340. The tips 369 are provided below the first side 342 of the housing 340. In an exemplary embodiment, the housing 340 includes slots 402 aligned with corresponding contact channels 400. The slots 402 receive the first contacts 228 (shown in phantom). The first contacts 228 slide in the slots 402 to mate with the corresponding second contacts 328. For example, the tips 269 of the second contacts 228 are loaded into the slots 402 as the second electrical connector 302 is moved in the connector mating direction 132. The first contacts 228 continued to slide forward during mating and are eventually aligned with the corresponding second contacts 328. The slots 402 allow forward movement and inward movement in the board loading direction 130 and the connector mating direction 132 during the mating process. The slots 402 guide mating of the first contacts 228 with the second contacts 328. Optionally, the contact channels 400 may provide clearance or space for the second contacts 328 to deflect during mating.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a first circuit card assembly having a first printed circuit board (PCB) and a first electrical connector, the first PCB including a first slot extending rearward from a first mating edge of the first PCB, the first electrical connector being mounted to the first PCB along the first slot, the first electrical connector having a first mating end and first contacts at the first mating end, each of the first contacts having a first mating interface; and
a second circuit card assembly having a second PCB and a second electrical connector, the second PCB having a second mating edge, the second electrical connector being mounted to the second PCB proximate to the second mating edge, the second electrical connector having a second mating end and second contacts at the second mating end, each of the second contacts having a second mating interface;
wherein the first and second circuit card assemblies are mated during a board mating stage such that the first PCB and the second PCB move relative to each other along a board mating axis parallel to the first slot with the first PCB oriented perpendicular to the second PCB and with the first and second mating ends of the first and second electrical connectors being oriented parallel to the board mating axis, the second mating edge of the second PCB being received in the first slot to align the second mating end of the second electrical connector with the first mating end of the first electrical connector for mating the second electrical connector with the first electrical connector;
wherein the first and second circuit card assemblies are mated during a connector mating stage such that the first electrical connector and the second electrical connector move relative to each other along a connector mating axis perpendicular to the board mating axis; and
wherein the first mating interfaces of the first contacts are mated to the second mating interfaces of the corresponding second contacts in a contact mating direction non-parallel to the board mating axis and non-parallel to the connector mating axis.

2. The communication system of claim 1, wherein the first and second PCBs move relative to each other along the board mating axis while the first and second electrical connectors move relative to each other along the connector mating axis.

3. The communication system of claim 1, wherein the first contact includes a first side including the first mating interface, the first side extending between a leading edge and a trailing edge, and wherein the second contact includes a mating beam having an interior face including the second mating interface, the interior face extending between a leading end and a trailing end of the mating beam, the leading edge moving past the leading end as the first and second contacts are moved in the contact mating direction to mate the first and second mating interfaces.

4. The communication system of claim 3, wherein the first contact extends between a base and a tip and wherein the second contact extends between a base and a tip, the tip of the first contact moving toward the base of the second contact as the first and second contacts are moved in the contact mating direction to mate the first and second mating interfaces.

5. The communication system of claim 4, wherein the second contact is open at the leading end to receive the first contact from the leading end and wherein the second contact is open at the tip to receive the first contact from the tip.

6. The communication system of claim 3, wherein at least one of the leading edge and the leading end includes a lead-in to guide mating of the first contact and the second contact.

7. The communication system of claim 1, wherein the second contact includes a socket defined by opposed mating beams receiving the corresponding first contact therebetween.

8. The communication system of claim 1, wherein the second electrical connector includes a housing mounted to the second PCB, the housing having contact channels holding corresponding second contacts, the housing having slots aligned with corresponding contact channels receiving the first contacts during mating of the first and second circuit card assemblies, the first contacts moving in the slots relative to the second contacts during mating of the first and second circuit card assemblies.

9. The communication system of claim 1, wherein the second contacts include stop features rearward of the second mating interfaces, the first contacts being configured to engage and stop against the stop features during mating of the first and second circuit card assemblies.

10. The communication system of claim 1, wherein either the first PCB or the second PCB is oriented horizontally and the other of the first PCB or the second PCB is oriented vertically.

11. The communication system of claim 1, wherein the first mating end is oriented perpendicular to the first PCB, and wherein the second mating end is oriented parallel to the second PCB.

12. A circuit card assembly for a communication system comprising:
a printed circuit board (PCB) having a first surface and a second surface extending along a primary axis and a secondary axis, the PCB having a mating edge between the first and second surfaces along the secondary axis, the PCB having a mounting area on the first surface adjacent the mating edge; and
an electrical connector mounted to the first surface at the mounting area, the electrical connector having a housing extending between a front and a rear, the front being provided proximate to the mating edge, the electrical connector having a mounting end extending between the front and the rear being mounted to the mounting area, the electrical connector having a mating end extending between the front and the rear along the primary axis, the mating end being configured to be mated to a mating electrical connector, the electrical connector having contacts held by the housing being terminated to the PCB, each contact having a mating beam extending along a beam axis between a base and a tip, the mating beam including an interior face defining a mating interface for mating with a mating contact of the mating electrical connector, the interior face extending between a leading end and a trailing end of the mating beam;
wherein each contact is configured to be mated with the mating contact in a contact mating direction non-parallel to the beam axis, wherein the interior face receives the mating contact across the interior face from the leading end toward the trailing end and down the interior face from the tip toward the base.

13. The circuit card assembly of claim 12, wherein the contact mating direction is at an angle of between 30° and 60° relative to the beam axis.

14. The circuit card assembly of claim 12, wherein the contact mating direction is angled toward the base and toward the trailing end.

15. The circuit card assembly of claim 12, wherein the contact is open at the tip to allow mating from a direction parallel to the beam axis and wherein the contact is open at the leading end to allow mating from a direction parallel to a transverse axis.

16. The circuit card assembly of claim 12, wherein the housing includes contact channels holding corresponding contacts, the housing having slots aligned with corresponding contact channels receiving the mating contacts during mating and allowing moving of the mating contacts in the slots relative to the contacts during mating.

17. A communication system comprising:
a first circuit card assembly having a first printed circuit board (PCB) and a first electrical connector mounted to the first PCB, the first PCB having a first surface and a second surface extending along a primary axis and a secondary axis, the first PCB having a first mating edge between the first and second surfaces along the secondary axis of the first PCB, the first PCB having a first slot between the first and second surfaces open at the first mating edge and extending a length along the primary axis of the first PCB, the first PCB having a first mounting area on the first surface adjacent the first slot with the first electrical connector mounted to the first mounting area, the first electrical connector having a front and a rear opposite the front, a mounting end extending between the front and the rear being mounted to the mounting area, and a mating end extending between the front and the rear along the primary axis of the first PCB, the first electrical connector having first contacts including mating ends at the mating end of the first electrical connector and terminating ends at the mounting end of the first electrical connector terminated to the first PCB, each of the first contacts having a first mating interface; and
a second circuit card assembly having a second PCB and a second electrical connector mounted to the second PCB, the second PCB having a first surface and a second surface extending along a primary axis and a secondary axis, the second PCB having a second mating edge between the first and second surfaces along the secondary axis of the second PCB, the second PCB having a second mounting area on the first surface proximate to the second mating edge with the second electrical connector mounted to the second mounting area, the second electrical connector having a front and a rear opposite the front, a mounting end extending between the front and the rear being mounted to the mounting area, and a mating end extending between the front and the rear along the primary axis of the second PCB, the second electrical connector having second contacts including mating ends at the mating end of the second electrical connector and terminating ends at the mounting end of the second electrical connector terminated to the second PCB, each of the second contacts having a second mating interface, the second mating edge of the second PCB being received in the first slot to align the mating end of the second electrical connector with the mating end of the first electrical connector;
wherein the first and second circuit card assemblies are mated during a board mating stage such that the first PCB and the second PCB move relative to each other along a board mating axis parallel to the first slot with the first PCB oriented perpendicular to the second PCB and with the first and second mating ends of the first and second electrical connectors being oriented parallel to the board mating axis, the second mating edge of the second PCB being received in the first slot to align the second mating end of the second electrical connector with the first mating end of the first electrical connector for mating the second electrical connector with the first electrical connector, and
wherein the first and second circuit card assemblies are mated during a connector mating stage such that the first electrical connector and the second electrical connector move relative to each other along a connector mating axis perpendicular to the board mating axis; and
wherein the first mating interfaces of the first contacts are mated to the second mating interfaces of the corresponding second contacts in a contact mating direction non-parallel to the board mating axis and non-parallel to the connector mating axis.

18. The communication system of claim 17, further comprising a chassis having a frame including a first rack holding the first circuit card assembly, the frame having a second rack configured to receive the second circuit card assembly in a loading direction parallel to the primary axis of the second circuit card assembly, the second mating edge being received in the first slot as the second circuit card assembly is inserted into the second rack in the loading direction.

19. The communication system of claim 17, wherein the first and second PCBs move relative to each other along the board mating axis while the first and second electrical connectors move relative to each other along the connector mating axis.

* * * * *